United States Patent [19]

Hung et al.

[11] Patent Number: 5,456,174
[45] Date of Patent: Oct. 10, 1995

[54] APPARATUS FOR MANUFACTURING SCREEN PRINTING PLATES

[76] Inventors: Ti-Kun Hung; Yin-Chern Hung, both of No. 39, Hsing Chung Street, Tai Ping Hsiang, Taichung Hsien, Taiwan

[21] Appl. No.: 329,157

[22] Filed: Oct. 26, 1994

[51] Int. Cl.[6] ...................................................... B41N 1/24
[52] U.S. Cl. ...................................... 101/128.4; 101/477
[58] Field of Search ................................. 101/114, 128, 101/128.1, 128.21, 128.4, 129, 425, 477, 483

[56] References Cited

U.S. PATENT DOCUMENTS

| 3,964,385 | 6/1976 | Knight | 101/128.4 |
| 4,903,595 | 2/1990 | Ericsson | 101/128.4 |
| 5,233,918 | 8/1993 | Hale | 101/128.4 |

Primary Examiner—Stephen Funk
Attorney, Agent, or Firm—Morton J. Rosenberg; David I. Klein

[57] ABSTRACT

A screen printing apparatus includes a screen exposed to a light source. A conveyer is arranged for receiving the exposed screen. Another conveyer is disposed below the previous conveyer and extended distal to the light source for receiving and for moving the screen. A turning device is disposed between the conveyers for turning the screen up-side-down. A washing device may provide water for washing the screen. A drying device is disposed beside the washing device for drying the washed screen. The screen printing plate can be made automatically.

3 Claims, 3 Drawing Sheets

5,456,174

APPARATUS FOR MANUFACTURING SCREEN PRINTING PLATES

BACKGROUND OF THE INVENTION

1. Field of the Invention

The present invention relates to a screen printing process, and more particularly to a screen printing apparatus for conducting the screen printing processes.

2. Description of the Prior Art

Typical screen printing processes comprise a lot of processes for making screen printing plates, and the processes are normally operated manually by operators. In addition, a number of expensive facilities are required for conducting the processes.

The present invention has arisen to mitigate and/or obviate the afore-described disadvantages of the conventional screen printing processes.

SUMMARY OF THE INVENTION

The primary objective of the present invention is to provide a screen printing apparatus for manufacturing screen printing plates automatically.

In accordance with one aspect of the invention, there is provided a screen printing apparatus comprising a light exposing station including a transparent plate for supporting a screen to be treated, an art work disposed above the plate, a light source disposed below the plate for lighting the art work and the screen, a first conveyer disposed beside the plate, means for pushing the screen toward the first conveyer, a second conveyer disposed below the first conveyer and extended distal to the light exposing station for receiving the screen from the first conveyer, means disposed between the first conveyer and the second conveyer for turning the screen up-side-down, a washing station arranged after the light exposing station and disposed above the first conveyer and part of the second conveyer and including means for supplying water and for washing the screen, and at least one drying station disposed above the second conveyer for drying the washed screen.

The turning means includes a rotary member rotatably supported between the first conveyer and the second conveyer, and an eccentric rod secured to the rotary member, the eccentric rod extends in parallel to the conveyers and moves eccentrically relative to the rotary member for turning the screen up-side-down.

A third conveyer is further disposed in parallel to the first conveyer and the second conveyer and disposed below the second conveyer for receiving the screen from the second conveyer and for moving the screen back to the light exposing station. A ramp is disposed between end portions of the second conveyer and the third conveyer for transferring the screen from the second conveyer to the third conveyer.

Further objectives and advantages of the present invention will become apparent from a careful reading of a detailed description provided hereinbelow, with appropriate reference to accompanying drawings.

DETAILED DESCRIPTION OF THE PREFERRED EMBODIMENT

Figure 1:
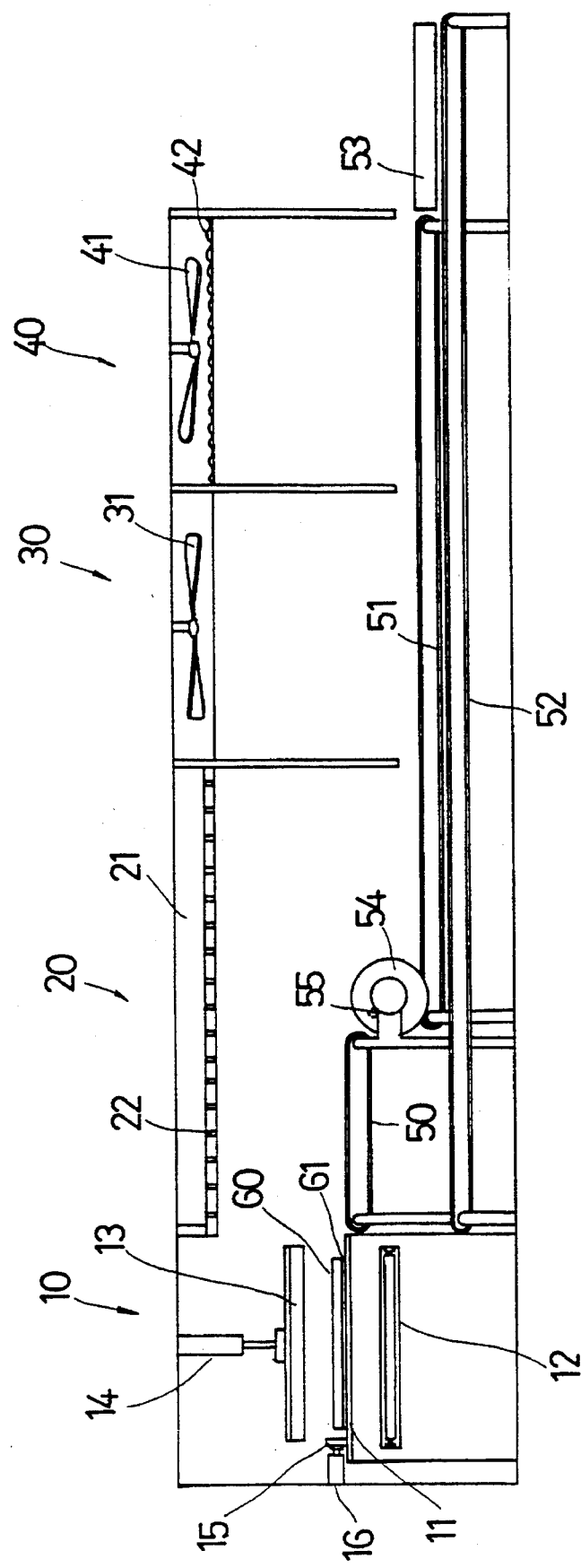
FIG. 1 is a front view of a screen printing apparatus in accordance with the present invention.
Figure 2:
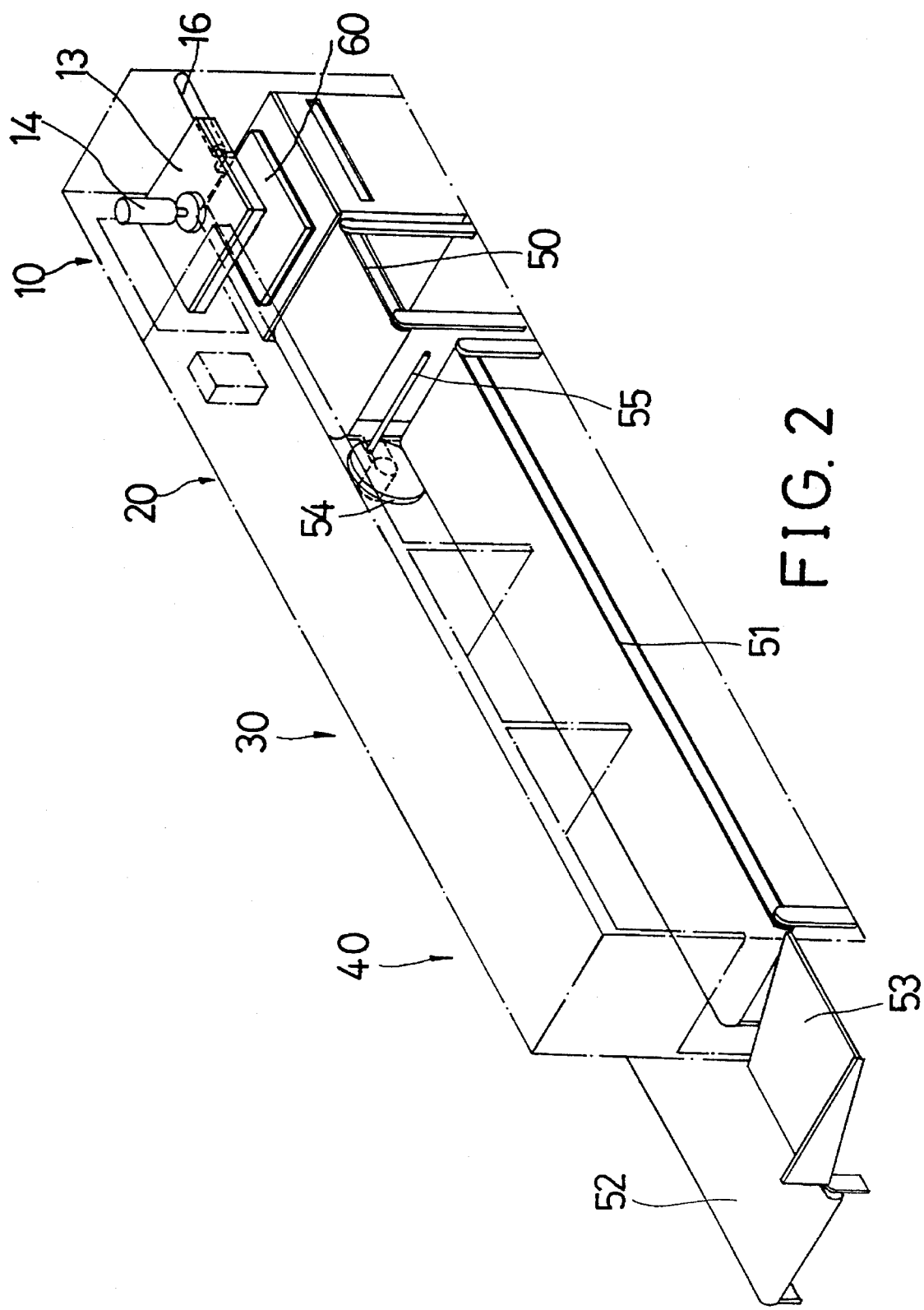
FIG. 2 is a rear perspective view of the screen printing apparatus.

Referring to the drawings, and initially to FIGS. 1 and 2, a screen printing apparatus in accordance with the present invention comprises a number of stations for continuously conducting the screen printing processes, including a light exposing station 10, a washing station 20, a drying station 30 and a heating station 40. The screen printing apparatus can be operated by computerized programs.

The light exposing station 10 includes a transparent plate 11 disposed horizontally, an art work or a continuous tone negative picture 61 is secured on top of the plate 11, a light source 12 disposed below the plate 11 for providing lights, a screen 60 disposed above the art work 61 and having sensitized emulsion applied thereon, and a rubber or sponge pad 13 secured to an actuator 14 and movable downward by the actuator 14 for pressing the screen 60 tightly in contact with the art work 61. The actuator 14 may be a pneumatic or a hydraulic cylinder. Another actuator 16 is disposed beside the screen 60 and includes a piston rod 15 for pushing the exposed screen 60 toward the washing station 20.

An endless conveyer 50 is disposed in the washing station 20 and extended about one half of the length of the washing station 20, and has a height close to the plate 11 for receiving the exposed screen 60. Another endless conveyer 51 is disposed below the conveyer 50 for receiving the exposed screen 60 transferred by the conveyer 51 and extends through the other half of the washing station 20, the drying station 30 and the heating station 40. A further conveyer 52 is disposed in parallel to the conveyers 50, 51 and is disposed below the conveyer 51. A ramp 53 is provided between the end portions of the conveyer 51 and 52 for transferring the exposed screen 60 to the conveyer 52 which moves the screen 60 back to the light exposing station 10 where the operators stand, best shown in FIG. 2. The washing station 20 includes a conduit 21 having a number of holes 22 provided therein and coupled to a water source for supplying water through the holes 22 and for washing the exposed screen in order to remove all unexposed portions and so as to leave openings in the screen through which ink may pass.

Figure 3:
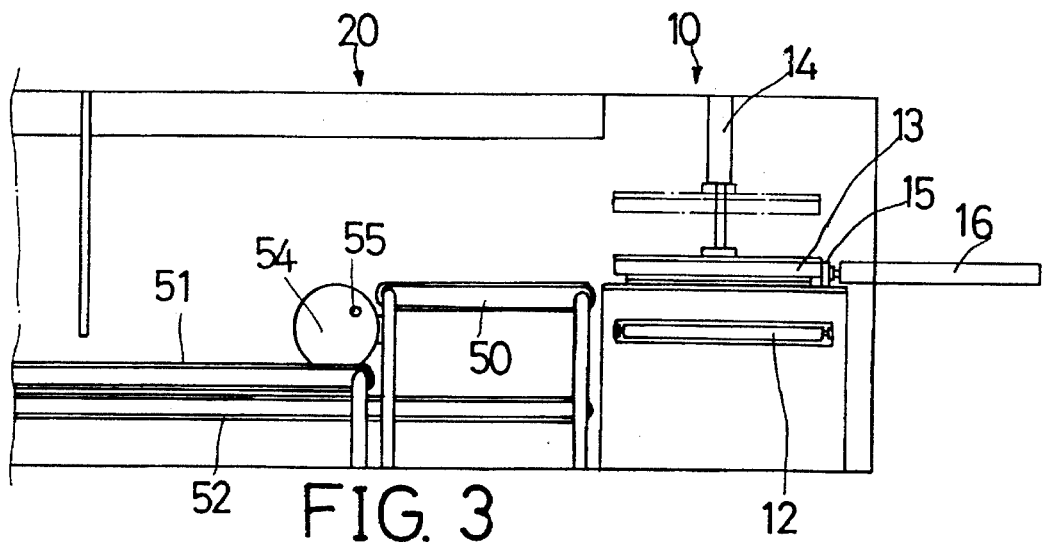
FIGS. 3, 4 and 5 are partial rear views illustrating the operation of the screen printing apparatus.
Figure 4:
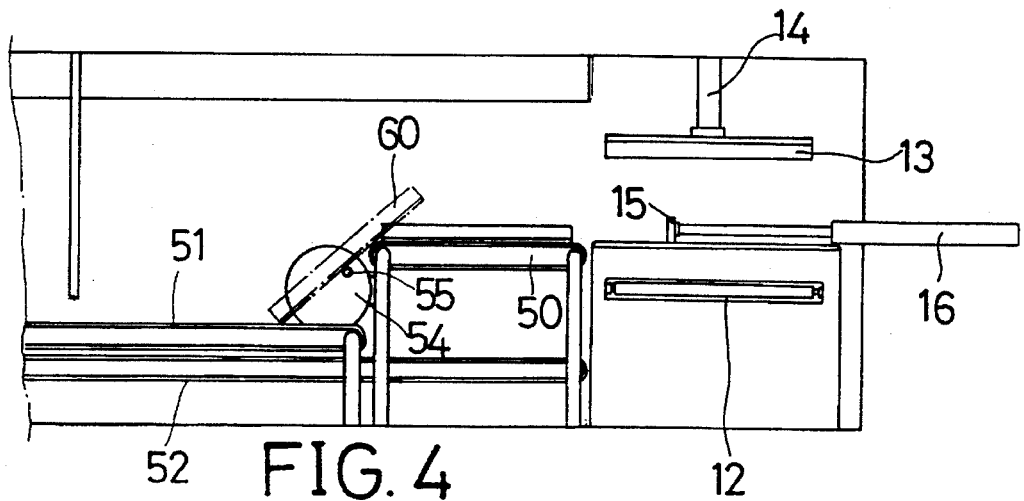
Figure 5:
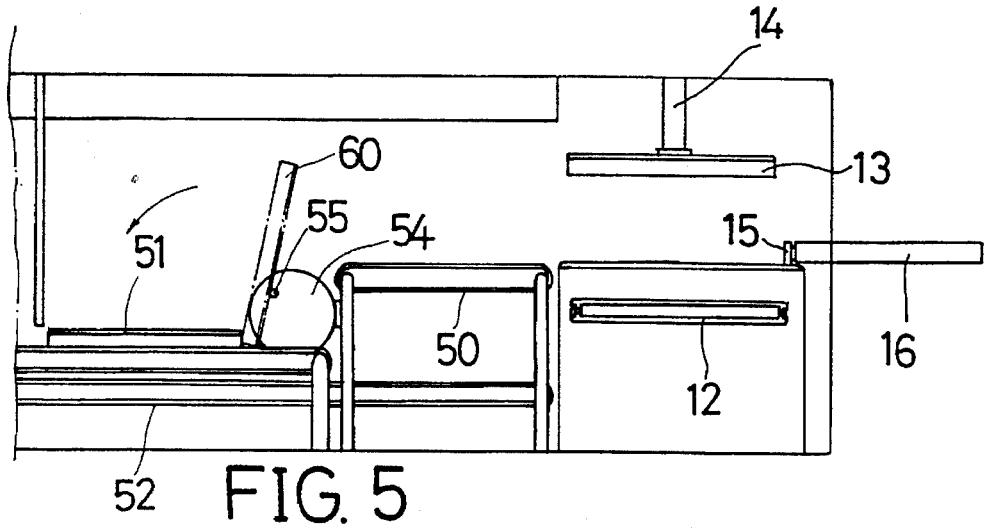

Referring next to FIGS. 3 to 5, and again to FIGS. 1 and 2, a disc 54 is rotatably supported between the conveyers 50, 51 and includes an eccentric rod 55 secured thereto. The eccentric rod 55 is extended in parallel to the conveyers 50, 51 and is rotated about a center point of the disc 54 so as to turn the screen 60 up-side-down when the screen 60 moves from the conveyer 50 to the other conveyer 51, such that both sides of the screen 60 can be suitably washed. The washed screen 60 is then blown by the fan blade 31 of the drying station 30, and heated by the hot air generated by the fan blade 41 and the heater 42 of the heating station 40. The dried and heated screen 60 is then moved back to the operators by the conveyer 52.

Accordingly, the screen plates can be manufactured automatically by the screen printing apparatus in accordance with the present invention.

Although this invention has been described with a certain degree of particularity, it is to be understood that the present disclosure has been made by way of example only and that numerous changes in the detailed construction and the combination and arrangement of parts may be resorted to without departing from the spirit and scope of the invention as hereinafter claimed.

We claim:

1. A screen printing apparatus comprising:

a light exposing station including a transparent plate for supporting a screen to be treated, an art work disposed above said plate, a light source disposed below said plate for lighting said art work and said screen, a first conveyer disposed beside said plate, means for pushing said screen toward said first conveyer, a second conveyer disposed below said first conveyer and extended distal to said light exposing station for receiving said screen from said first conveyer, means disposed between said first conveyer and said second conveyer for turning said screen up-side-down, a washing station arranged after said light exposing station and disposed above said first conveyer and part of said second conveyer, said washing station including means for supplying water and for washing said screen, and at least one drying station disposed above said second conveyer for drying said washed screen.

2. A screen printing apparatus according to claim 1, wherein said turning means includes a rotary member rotatably supported between said first conveyer and said second conveyer, and an eccentric rod secured to said rotary member, said eccentric rod extends in parallel to said conveyers and rotates about a center point of said rotary member for turning said screen up-side-down.

3. A screen printing apparatus according to claim 1 further comprising a third conveyer disposed in parallel to said first conveyer and said second conveyer and disposed below said second conveyer for receiving said screen from said second conveyer and for moving said screen back to said light exposing station, and a ramp disposed between end portions of said second conveyer and said third conveyer for transferring said screen from said second conveyer to said third conveyer.

\* \* \* \* \*